United States Patent [19]
Travis

[11] 3,882,264
[45] May 6, 1975

[54] EYELET IN FLEXIBLE CIRCUITRY

[75] Inventor: Lawrence R. Travis, Brockton, Mass.

[73] Assignee: AMP Incorporated, Harrisburg, Pa.

[22] Filed: Nov. 23, 1971

[21] Appl. No.: 201,427

Related U.S. Application Data

[62] Division of Ser. No. 694,476, Dec. 29, 1967, abandoned.

[52] U.S. Cl. .................... 174/68.5; 29/625; 29/626; 29/512; 113/116 FF; 317/101 B
[51] Int. Cl. .............................................. H05k 1/02
[58] Field of Search .... 174/68.5; 317/101 B, 101 C, 317/101 CC; 29/625, 626, 265, 512, 432.2; 24/141

[56] References Cited

UNITED STATES PATENTS

| | | | |
|---|---|---|---|
| 1,481,217 | 1/1924 | Maloy | 24/141 |
| 2,433,384 | 12/1947 | McLarn | 29/265 UX |
| 3,072,734 | 1/1963 | Fox et al. | 317/101 CE |

FOREIGN PATENTS OR APPLICATIONS

| | | | |
|---|---|---|---|
| 277,489 | 10/1965 | Australia | 24/141 |
| 1,246,840 | 8/1967 | Germany | 174/68.5 |

*Primary Examiner*—Darrell L. Clay
*Attorney, Agent, or Firm*—William J. Keating; Jay L. Seitchik; Frederick W. Raring

[57] ABSTRACT

An eyelet integrated in flat, flexible circuitry for use as a site at which electrical connection can be made is shown. A hole is formed in conductive foil bonded to flexible backing. The foil and backing at the periphery of the hole are thereafter bent to provide a rounded surface of conductive foil in the eyelet thus formed.

1 Claim, 6 Drawing Figures

PATENTED MAY 6 1975

3,882,264

LAWRENCE R. TRAVIS
INVENTOR.

BY
McLean, Morton and Boustead
ATTORNEYS

EYELET IN FLEXIBLE CIRCUITRY

This application is a division of copending application Ser. No. 694,476, filed Dec. 29, 1967, now abandoned.

This invention relates to forming eyelets in flexible circuits comprising conductive foil bonded to insulatory backing and more specifically to forming a hole in flat conductive foil bonded to flat dielectric backing and bending the foil and backing upon itself to form a rounded conductive surface in the eyelet so formed.

Flexible circuits including among other things printed circuits are rapidly gaining acceptance in a variety of electrical and electronic applications. Flat webs of flexible dielectric material upon which a plurality of lines, i.e., circuit paths, of conductive foil are bonded are used for many purposes. The lines of conductive foil usually are encapsulated in a plastic material. Circuits are produced by a number of techniques including the bonding of a foil of conductive material to a flexible dielectric polymeric base, the selective etching of portions of the conductive foil not desired as circuit paths and the encapsulation of the base and relieved circuit paths with a suitable protective overlayer. It is often necessary to make connection with the conductors of such circuits. The connection to a conductor should not weaken the foil or the flexible dielectric backing and should be easily prepared. Desirably the connection should be accessible from each side of the flexible circuit and should be readily resolderable.

It is thus a primary object of this invention to provide in a flexible circuit an eyelet which is a site at which an electrical connection can be made.

It is a further object of this invention to provide an eyelet which does not weaken the strength of the flexible circuit and which provides an electrically and mechanically satisfactory site for connection.

It is still a further object of this invention to provide an eyelet in a simple mechanical operation which eyelet is integrally formed of the conductive foil.

It has been found that an eyelet can be formed in a circuit comprised of conductive foil bonded to insulatory backing by forming a hole through both the foil and the insulatory backing and then bending the foil and the backing on the periphery of the hole backwards upon itself so as to leave a surface of conductive foil on the periphery of the hole. Preferably the bend in the foil and backing is rounded to prevent the formation of corners or creases which might have deleterious electrical effects or reduce the structural strength of the eyelet; economy of space dictates bending the foil and backing until the backing makes contact with itself.

The eyelet is preferably formed in a pad or otherwise enlarged or strengthened portion of the conductive foil. First a hole is formed in the center of the pad wherein the eyelet is to be formed. This can be accomplished by projecting a punch having a sharp circular punching edge against the foil or by other suitable methods. Then the surfaces on all sides of the punched hole are bent and forced backwardly until the insulatory backing makes contact with itself. Thus the eyelet formed has a continuous surface of conductive foil which provides good properties for connection with other circuits or conductors. A preferred method of bending the peripheral portions of the foil and backing about the punched hole is to force a die having bending surfaces into contact with the foil and backing against a platen on the opposite side of the pad, while guiding the peripheral portions of the foil into the bending surfaces.

A preferred apparatus for accomplishing this includes a die and a platen having a punch and means for thrusting the one against the other. The die has concave bending surfaces receding from the center of its working surface and a centrally located depression to receive the punch. The platen has a flat working surface and a centrally located recess from which the punch protrudes. The punch which acts as a guide for the foil and backing is resiliently urged into its protruding position by resilient means located within the body of the platen. As the die and platen which are situated on the opposite sides of the pad are forced against one another a hole is punched and the areas of foil and backing at the periphery of the punched hole are guided into the concave bending surfaces. The platen and die are brought into close confronting relationship and the punch which first contacts the recess in the die is forced into the body of the platen.

As the foil forming the pad is often encapsulated, it is necessary to provide an opening in the encapsulation layer at the location at which an eyelet is to be formed to expose the pad to the eyelet forming device.

IN THE DRAWINGS

Figure 1:
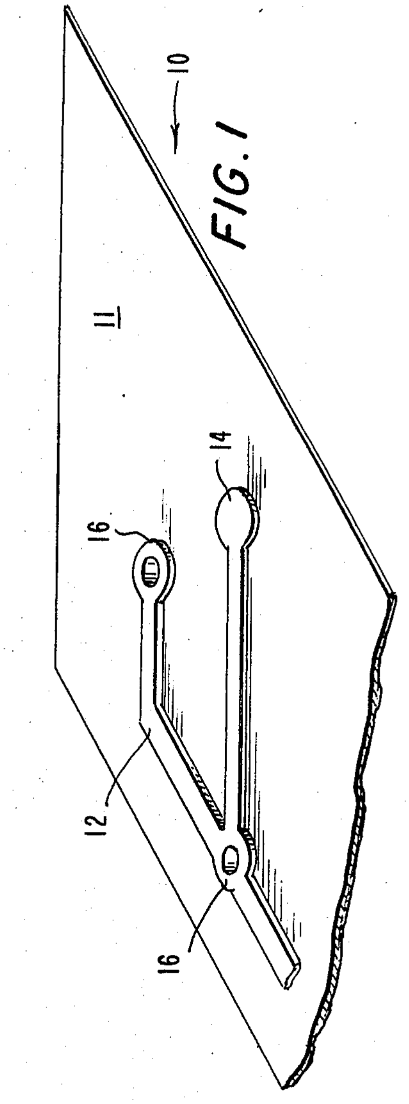
FIG. 1 is a view of a simplified flexible circuit showing pads with eyelets already formed therein.

In FIG. 1, reference numeral 10 refers generally to a flexible circuit. The circuit is comprised of a polyamide-polyimide backing 11 which provides good dielectric properties as well as dimensional stability to the circuit. Reference numeral 12 refers to a line of conductive foil which forms a circuit path in the circuitry and reference numeral 14 designates a pad or enlarged area wherein an eyelet is to be formed. Reference numeral 16 refers to a pad in which an eyelet has already been formed. Although ordinarily a layer of encapsulating material such as polyester film overlies the flexible circuit, for simplicity in FIG. 1 this layer is not shown.

Figure 2:
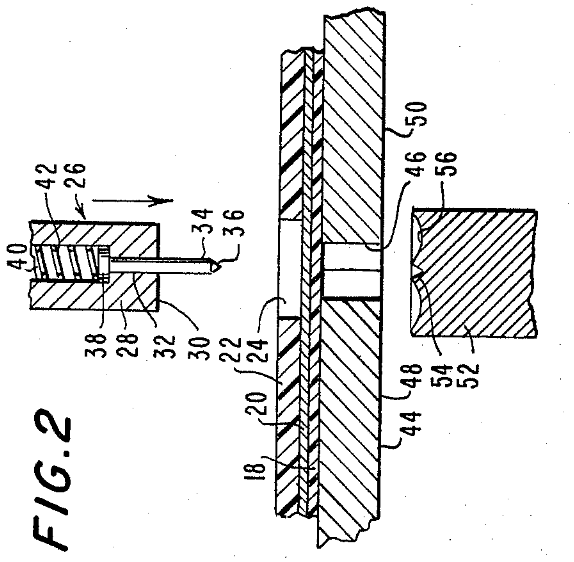
FIG. 2 is a sectional view through the pad of a flexible circuit prior to formation of an eyelet and showing the platen, punch and die.

In FIG. 2 reference numeral 18 refers to the polyamide-polyimide backing, reference numeral 20 refers to the conductive foil and reference numeral 22 refers to the polyester film encapsulating material. A portion 24 of layer 22 has been removed and it will be at this exposed area that an eyelet will be formed.

Reference numeral 26 refers generally to the platen and its resiliently mounted punch. The platen has body 28 and annular working surface 30. A recess 32 is provided in the body 28 of the platen, and a punch having shank 34 and sharp rounded punching surface 36 protrudes from the recess. The base of the punch designated by reference numeral 38 is urged downwardly by spring 40 in interior housing 42 of platen 26. A support table 44 having a central orifice 46 underlies the flexible circuit. Support table 44 is comprised of leaves 48 and 50 which are retractable horizontally to provide a greater working area for the platen and die. Thus as shown in FIG. 2 leaves 48 and 50 are close to one another and the unsupported area of the flexible circuit is very small, this facilitates the punching step. Located below support table 44 and at the center thereof is die 52 which has a recess 54 at the central zone of its working surface and concave bending surfaces 56 located outwardly thereof for forming the eyelet.

Figure 3:
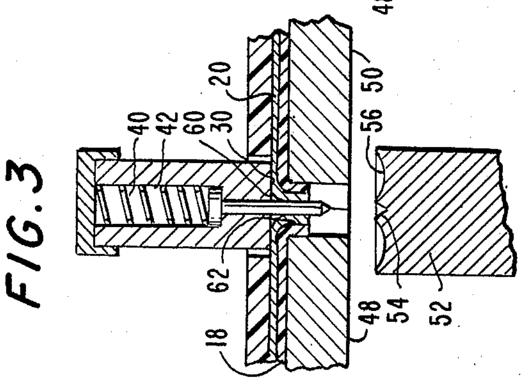
FIG. 3 shows a hole being punched in the conductive foil and insulatory backing.

In FIG. 3 platen 26 has been urged downwardly and a hole 60 has been punched by punch 34 in conductive foil 20 and backing 18. The punch has proceeded downwardly through foil and backing and has turned the edges 62 thereof at the periphery of the punched hole downwardly. Working surface 30 of platen 26 is now flush with the outer surface of conductive foil 20.

Figure 4:
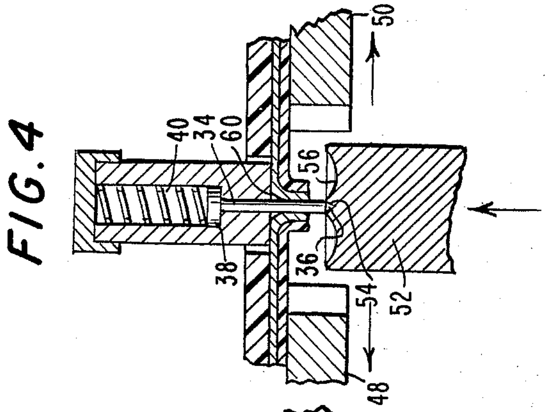
FIG. 4 shows the foil and backing in the initial eyelet forming step.

In FIG. 4 die 52 has been moved upwardly until contact of punch 34 and central recess 54 takes place. Simultaneously, leaves 48 and 50 of support table 44 have been moved to the left and right respectively to provide a greater space for forming the eyelet.

Figure 5:
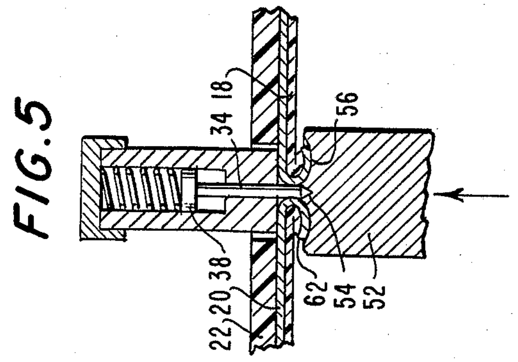
FIG. 5 shows the foil and backing in the last stage of eyelet formation.

In FIG. 5 die 52 is shown urged upwardly towards platen 26. Punch 34 is thus forced into housing 42 and spring 40 is compressed. As die 52 is urged upwardly the edges 62 of backing and foil are directed along its surfaces and ultimately slidably contact bending surfaces 56.

As shown, these edges are forced to conform to bending surfaces 56 and they flare downwardly and backwardly under the influence of those surfaces. As die 52 and platen 26 are brought into close confronting relationship the outermost areas of bending surfaces 56 which flare upwardly force the insulatory backing to be bent backwards upon itself. Where greater mechanical strength of the eyelet is required, a flat copper washer can be positioned against the underside of backing 18 before die 52 is urged upwardly toward platen 26 such that bending surfaces 56 are caused to enclose the washer as they are formed by die 52.

Although the apparatus shown in the drawings includes a punch, other methods of forming a hole in the conductive foil and flexible backing are equally suitable. For example, a hole may be drilled or cut by means well known in the art before the backing is bent upon itself to form the eyelet. Depending upon the size of the desired eyelet, and the thickness and nature of the conductive foil and insulatory backing, the foil and backing may be subjected to varying amounts of deflection prior to puncture. One alternative technique embraced within the invention includes contacting the foil and backing with a die having a protruding cup-shaped center part in order to form the desired hole.

What is claimed is:

1. An integral eyelet in flexible circuitry which circuitry comprises thin, flexible conductive foil bonded to a surface of thin flexible, insulative, plastic backing, said eyelet including an opening defined through said foil and backing with the peripheral portion of said foil and said backing about said opening bent backwards upon itself, with the backing in contact with itself and with the foil exposed about the periphery of said opening overlying said backing on each side of said opening, the thickness of said eyelet adjacent said opening being approximately twice the thickness of said foil and backing.

* * * * *